(12) United States Patent
Mori

(10) Patent No.: US 7,206,060 B2
(45) Date of Patent: Apr. 17, 2007

(54) ILLUMINATION OPTICAL SYSTEM, EXPOSURE APPARATUS, AND DEVICE FABRICATION METHOD WITH A POLARIZING ELEMENT AND AN OPTICAL ELEMENT WITH LOW BIREFRINGENCE

(75) Inventor: Kenichiro Mori, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 84 days.

(21) Appl. No.: 11/112,989

(22) Filed: Apr. 22, 2005

(65) Prior Publication Data

US 2005/0237527 A1     Oct. 27, 2005

(30) Foreign Application Priority Data

Apr. 23, 2004   (JP)   ............................. 2004-128602

(51) Int. Cl.
G03B 27/72     (2006.01)
G03B 27/28     (2006.01)

(52) U.S. Cl. ......................................... 355/71; 359/497

(58) Field of Classification Search ........ 359/494–500; 501/54; 355/71
See application file for complete search history.

(56) References Cited

U.S. PATENT DOCUMENTS

| | | | |
|---|---|---|---|
| 6,475,682 B2* | 11/2002 | Priestley et al. | ................ 430/5 |
| 6,583,931 B2* | 6/2003 | Hiraiwa et al. | ............. 359/497 |
| 2004/0104359 A1* | 6/2004 | Komatsuda et al. | ..... 250/492.2 |

* cited by examiner

Primary Examiner—Henry Hung Nguyen
Assistant Examiner—Chia-how Michael Liu
(74) Attorney, Agent, or Firm—Morgan and Finnegan, LLP

(57) ABSTRACT

An illumination optical system for illuminating a target surface using light from a light source, said illumination optical system includes a polarizing element that is arranged in an optical path from the light source to the target surface, and adjusts a polarization ratio of the light, and an optical element that is arranged in an optical path from the polarizing element to the target surface, wherein the total birefringence of the optical element is $m+2\sigma<1.0$ nm/cm, where an average of birefringence amount of a glass material of the optical element is m, and standard variation birefringence amount of a glass material of the optical element is $\sigma$.

7 Claims, 13 Drawing Sheets

PRIOR ART

ILLUMINATION OPTICAL SYSTEM, EXPOSURE APPARATUS, AND DEVICE FABRICATION METHOD WITH A POLARIZING ELEMENT AND AN OPTICAL ELEMENT WITH LOW BIREFRINGENCE

BACKGROUND OF THE INVENTION

The present invention relates generally to an illumination optical system for illuminating a target surface with light from a light source, an exposure apparatus, and a device fabrication method, and more particularly to an illumination optical system for illuminating a reticle (or a mask) which forms a pattern with short wavelength light. The present invention is suitable for a projection exposure apparatus used in a photolithography process for fabricating semiconductor devices, liquid crystal display devices, image pick-up devices (CCD, and the like), thin-film magnetic heads, and the like.

An exposure apparatus is used in a photolithography process in a semiconductor device fabrication process. The photolithography process is a process of projection transcribing a circuit pattern of the semiconductor device on a substrate (silicon substrate, and the like) that becomes the semiconductor device.

Minute semiconductor devices have been increasingly demanded. The minimum line width of a line and space demanded is 0.15 μm or less, and reaching 0.10 μm. The improvement of a resolution of the projection optical system used for the photolithography process is necessary to create minute semiconductors.

In general, a line width R that can be resolved in the photolithography process can be determined by using an exposure light-source wavelength λ, the numerical aperture NA of the exposure apparatus, and proportionality factor k1 as in the following equation:

$$R = k_1 \times \frac{\lambda}{NA} \quad (1)$$

Therefore, if the wavelength λ is shortened, the line width R that can be resolved decreases in proportion to wavelength. Moreover, if the numerical aperture NA is increased, the line width R that can be resolved decreases in inverse proportion to numerical aperture. Recently, producing exposure light of short wavelength and making to the high NA projection optical system were advanced. The exposure light source of the current mainstream projection exposure apparatus is KrF excimer laser with a wavelength of 248 nm. The projection exposure apparatus that is developed using ArF excimer laser (with a wavelength of 193 nm) and $F_2$ laser (with a wavelength of 157 nm). Moreover, the current mainstream NA is about 0.80, but the projection exposure apparatus that is developed has NA of 0.90.

However, a glass material with high transmittance is limited to the short wavelength of the light source, and a glass material that can be used by the wavelength of 157 nm is only a calcium fluoride ($CaF_2$) at present. Thereby, it is examined to use a catadioptric system that combines a dioptric system with a catoptric system as the projection optical system to correct a chromatic aberration with a single glass material.

An optical system that uses a 45° mirror is proposed as an example of the catadioptric system as shown in FIG. 5 (see, for example, Japanese translation of PCT international Application Publication No. 7-111512). The reflectivity of the 45° mirror is different in S-polarized light (a light beam whose direction of electric field vector is vertical to a normal of a reflection surface and traveling direction of the light beam) and P-polarized light (an orthogonal light beam to the s-polarized light). Therefore, the transmittance between the reticle and the wafer is different between the light beam that becomes p-polarized light and the light beam that becomes s-polarized light for the mirror in the catadioptric system.

On the other hand, in the projection exposure apparatus, a contrast of an interference fringe that the line and space of the reticle forms a photoresist on the wafer is known as follows: S-polarized light has higher contrast than P-polarized light for a diffraction light of the line and space.

Therefore, in the projection exposure apparatus that uses the projection optical system of the catadioptric system that has the 45° mirror shown in FIG. 5, if light intensity equal to light intensity of S-polarized light and P-polarized light illuminates the reticle, the contrast changes depending on the pattern direction.

A situation that applies a reticle to form a pattern repeated in y direction to the optical system shown in FIG. 5, is shown in FIG. 6. A situation that applies a reticle to form a pattern repeated in x direction to the optical system shown in FIG. 5 is shown in FIGS. 7A and 7B. A diffraction light of the repeatedly pattern in y direction shown in FIG. 6 is reflected to the x direction, and s-polarized light component of the diffraction light becomes s-polarized light component for the mirror. A diffraction light of the repeated pattern in x direction shown in FIG. 7 is reflected to the y direction, and s-polarized light component of the diffraction light becomes p-polarized light component for the mirror.

The reflectivity of the mirror is different in S-polarized light component and P-polarized light component So S-polarized light component of the diffraction light diffracted by each of the repeated patterns shown in FIG. 6 and the repeated patterns shown in FIG. 7 becomes S-polarized light and P-polarized light respectively for the mirror, and a transmittance that transmits the projection optical system is different. A transmittance that is composed of S-polarized light component and P-polarized light component does not depend on the pattern and is constant, and a light intensity ratio of S-polarized light component and P-polarized light component of the diffraction light that reaches the wafer is different depending on the pattern direction. As mentioned above, the contrast is different in S-polarized light component and P-polarized light component. If the same light intensity as light intensity of S-polarized light and P-polarized light illuminates the reticle, the contrast difference, that depends upon the pattern direction, is caused in the projection exposure apparatus that uses the projection optical system of the catadioptric system.

Therefore, if the same light intensity as a light intensity of S-polarized light and P-polarized light illuminates the reticle, the contrast is different depending on the pattern direction, and an error occurs (called "HV difference") that changes depending on the pattern direction. Thereby, the semiconductor device fabrication yield decreases by using the projection exposure apparatus.

Then, a method of illuminating the reticle surface by partial polarized light, and equating compared with the light intensity ratio of S-polarized light and P-polarized light in the wafer surface is proposed (see, for example, Japanese Patent No. 2000-3852).

When forming a predetermined polarization ratio in the illumination optical system, the polarization state changes by a birefringence generated by a birefringence of the glass material of the illumination optical system until the reticle surface and a stress that given the lens when lens is fixed until the stress is reduced to produce the predetermined ratio.

FIGS. 8A and 8B shows a calculation result that the light of S-polarized light at the pupil position of the illumination optical system change into the light intensity distribution (of S-polarized light and P-polarized light) at the reticle surface. This illumination optical system has an optical system that adjusts the polarization ratio at the pupil position, is used for the light source of light with a wavelength of 157 nm, and a calcium fluoride that has birefringence amount of 2 nm/cm on m+2σ (m: average, σ: variance) is used as a lens of the illumination optical system.

A thickness of the glass material from the pupil position of the illumination optical system to the reticle is about 500 mm, and a number of lens is 15. The right side drawing is a pupil distribution of P-polarized light at a predetermined point on the reticle surface. The S-polarized light might change into P-polarized light by the birefringence of the lens even in case of incidence. For example, when the birefringence of the calcium fluoride is 2 nm/cm, maximum 25% P-polarized light is generated at the reticle surface.

FIG. 9 shows a relationship between a birefringence amount of the glass material used for the illumination optical system lens and the maximum P-polarized light intensity in a pupil of the reticle surface made by light of S-polarized light at pupil position of the illumination system. Plural points in the same birefringence amount is one that a built-in angle of lens to a lens barrel was changed, and the maximum P-polarized light intensity in the pupil in the reticle surface changes by combining a phase advance axis. The ratio of S-polarized light changing into P-polarized light increases as the birefringence amount increases as shown on graph on FIG. 9. When assuming that the birefringence of 5 nm/cm is allowed, the light of 90% of S-polarized light at the pupil position of the illumination optical system might change into the P-polarized light.

BRIEF SUMMARY OF THE INVENTION

Accordingly, it is an exemplary object to provide an illumination optical system that can achieve a desired polarized light illumination on a reticle surface.

An illumination optical system of one aspect according to the present invention for illuminating a target surface using light from a light source, the illumination optical system includes a polarizing element that arranged in an optical path from the light source to the target surface, and adjusts a polarization ratio of the light, and an optical element that is arranged in an optical path from the polarizing element to the target surface, wherein the optical element is m+2σ<1.0 nm/cm, where an average of birefringence amount of a glass material of the optical element is m, and standard variation birefringence amount of a glass material of the optical element is σ.

An illumination optical system of another aspect according to the present invention for illuminating a target surface using light from a light source, the illumination optical system includes a polarizing element that is arranged in an optical path from the light source to the target surface, and adjusts a polarization ratio of the light, wherein an optical element that has power is not arranged in an optical path from the polarizing element to the target surface.

An exposure apparatus of another aspect according to the present invention includes an illumination optical system for illuminating a target surface using light from a light source, and a projection optical system for channeling the light that passes through the target surface onto a substrate, wherein said illumination optical system includes a polarizing element that is arranged in an optical path from the light source to the target surface, and adjusts a polarization ratio of the light, and an optical element that is arranged in an optical path from the polarizing element to the target surface, wherein the optical element is m+2σ<1.0 nm/cm, where an average of birefringence amount of a glass material of the optical element is m, and standard variation birefringence amount of a glass material of the optical element is σ.

An exposure apparatus of another aspect according to the present invention includes an illumination optical system for illuminating a target surface using light from a light source, and a projection optical system for channeling the light that passes through the target surface onto a substrate, wherein said illumination optical system includes a polarizing element that is arranged in an optical path from the light source to the target surface, which adjusts a polarization ratio of the light, wherein an optical element that has power is not arranged in an optical path from the polarizing element to the target surface.

A device fabrication method of another aspect according to the present invention includes the steps of exposing an object using an exposure apparatus, and performing a development process for the object exposed, wherein the exposure apparatus includes an illumination optical system for illuminating a target surface using light from a light source, and a projection optical system for channeling the light that passes through the target surface onto a substrate, wherein said illumination optical system includes a polarizing element that is arranged in an optical path from the light source to the target surface, and adjusts a polarization ratio of the light, and an optical element that is arranged in an optical path from the polarizing element to the target surface, wherein the optical element is m+2σ<1.0 nm/cm, where an average of birefringence amount of a glass material of the optical element is m, and standard variation birefringence amount of a glass material of the optical element is σ.

A device fabrication method of another aspect according to the present invention includes the steps of exposing an object using an exposure apparatus, and performing a development process for the object exposed, wherein the exposure apparatus includes an illumination optical system for illuminating a target surface using light from a light source, and a projection optical system for channeling the light that passes through the target surface onto a substrate, wherein said illumination optical system includes a polarizing element that is arranged in an optical path from the light source to the target surface, and adjusts a polarization ratio of the light, wherein an optical element that has power is not arranged in an optical path from the polarizing element to the target surface.

Other objects and further features of the present invention will become readily apparent from the following descripton of the preferred embodiments with reference to the accompanying drawings.

DETAILED DESCRIPTION OF THE PREFERRED EMBODIMENTS

FIRST EMBODIMENT

Figure 1:
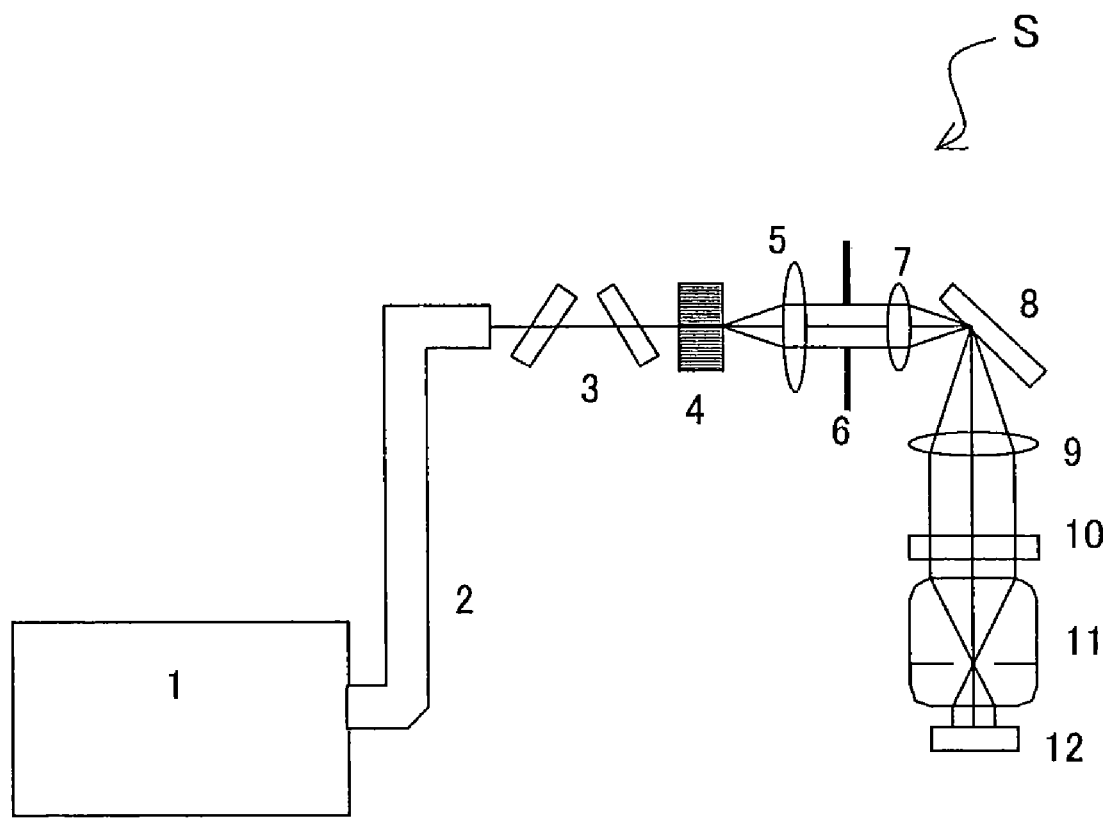
FIG. 1 is a schematic structure view of an exposure apparatus that includes an illumination optical system of the first embodiment according to the present invention.
Figure 9:
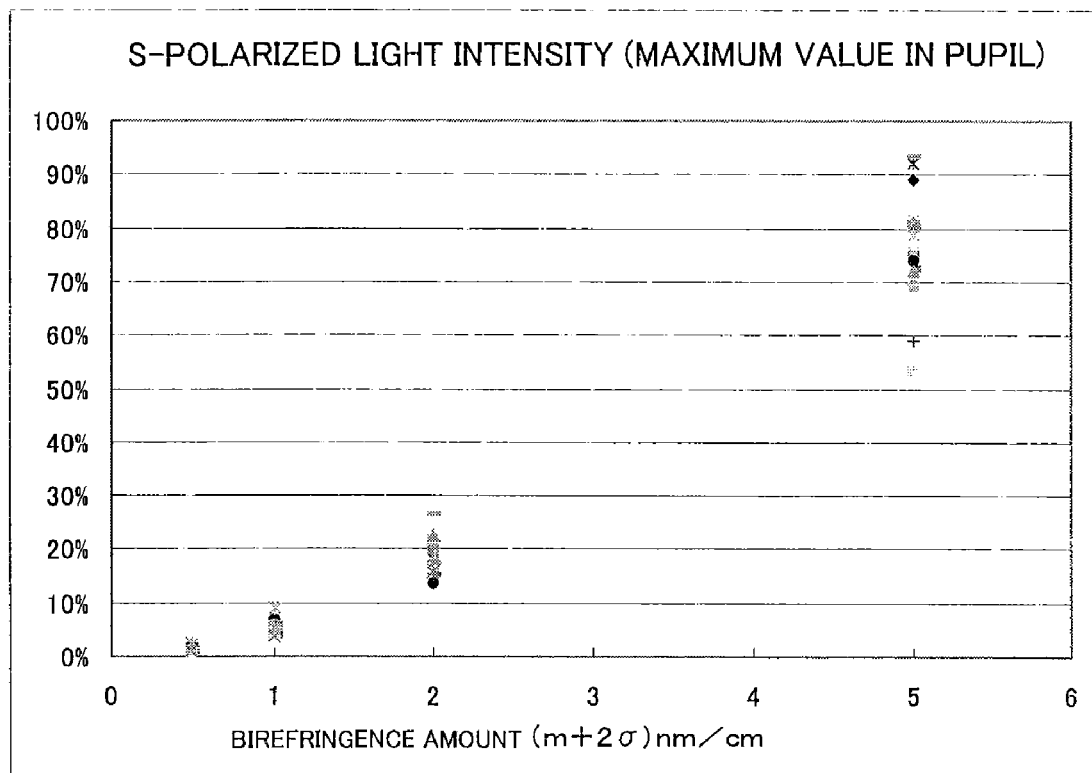
FIG. 9 is a graph of a relationship between a birefringence amount of a glass material used for an illumination optical system lens and the maximum P-polarized light intensity in a pupil of a reticle surface made by light of S-polarized light at pupil position of the illumination system.

With reference to FIG. 1, a description will be given of an illumination optical system of the first embodiment according to the present invention. FIG. 1 is a schematic structure view of an exposure apparatus S that includes the illumination optical system of the instant embodiment. A light source 1 uses KrF excimer laser, ArF excimer laser, or $F_2$ laser etc. A beam shaping optical system 2 channels a light from the light source 1, and forms a desired light intensity distribution on a fly-eye lens 4. A polarizing element 3 adjusts a polarization ratio to be a predetermined polarization ratio at a reticle 10 surface (target surface). The fly-eye lens 4 wavefront-divides the light from the light source 1, and forms a plural secondary light source. A condenser lens 5 overlaps light from the secondary light source formed by the fly-eye lens 4 to the masking blade 6. Thereby, a uniformly light intensity distribution is obtained. A lens 7 and a lens 9 as an optical element are a relay optical system, and form a conjugate relationship between the masking blade 6 and the reticle 10 by reflecting the light that passes through the masking blade 6 as an optical element at a folding mirror 8. If an incident angle differs greatly from 45° when reflecting by the folding mirror 8, a phase difference between the light of P-polarized light and the light of S-polarized light for the mirror is generated by a dielectric reflection film formed on the mirror, and the polarization state collapses. Then, the incident angle to the folding mirror 8 may be within 45°±30°. Moreover, a dielectric transmission film generates the phase difference that is smaller than the phase difference on the reflection film by the polarized light when greatly inclining towards the surface. Therefore, the incident light to the lens and the exit light from the lens may be within 0°±50°. The illumination optical system is composed of the items from the beam shaping optical system 2 to the lens 9 just before the reticle 10, and the illumination optical system and the light source 1 compose the illumination optical apparatus. A projection optical system 11 projects a pattern of the reticle 10 onto a wafer (substrate) 12 onto which the photoresist is applied. The present invention adjusts the birefringence of an optical member on an optical path from the polarizing element 3 to the reticle 10 to 1 nm/cm or less on m+2σ to maintain the polarization ratio formed by the polarizing element 3 and illuminates the reticle 10. Therefore, the change of the polarization ratio can be suppressed to 10% or less as shown in FIG. 9, and an enough imaging performance can be obtained.

If the stress is given to the lens when the lens is held, the birefringence is caused in the lens. When the optical member on the optical path from the polarizing element 3 to the reticle 10 is held, it is necessary to hold the optical member so that the stress should be as little as possible. The polarizing element 3 is composed of one or more inclined surfaces to the optical path that has a dielectric multilayer film inclined to the optical path. When the surface is vertical to the optical path (in other words, an optical axis), a distinction between S-polarized light and P-polarized light is difficult, so it is necessary to incline the surface. An incline angle of the surface may be between 15° and 65° in the film design. When the dielectric multilayer film (as follows "dielectric film") is formed by two surfaces it may be formed in the shape of the Japanese "ハ" character in the vertical direction on the optical axis by inclining two surfaces in the opposite direction to equate the polarized light characteristic of upward light ray and a downward light ray for the optical axis (reference to FIG. 1). Moreover, when the angle of the light ray that is incident onto the polarizing element 3, the transmittance or reflectivity of S-polarized light and P-polarized light changes. Then, a light intensity bary-center of a light group that is incident onto each point of the polarizing element 3 may be parallel to the optical axis.

In FIG. 1, the polarizing element 3 that adjusts the polarization ratio by the dielectric film uses a transmission type, and may use a reflection type element. When the polarization ratio is adjusted by the dielectric film, unnecessary light is diffused outside of the optical path by the reflection or transmission and the light intensity is adjusted to achieve the desired polarization ratio. As a result, the light intensity on the wafer surface decreases, and the throughput decreases. Therefore, when a pattern that is transferred is not influenced by the HV difference of the polarized light, it is desirable to expose with high intensity light without inserting the polarizing element.

SECOND EMBODIMENT

Figure 2:
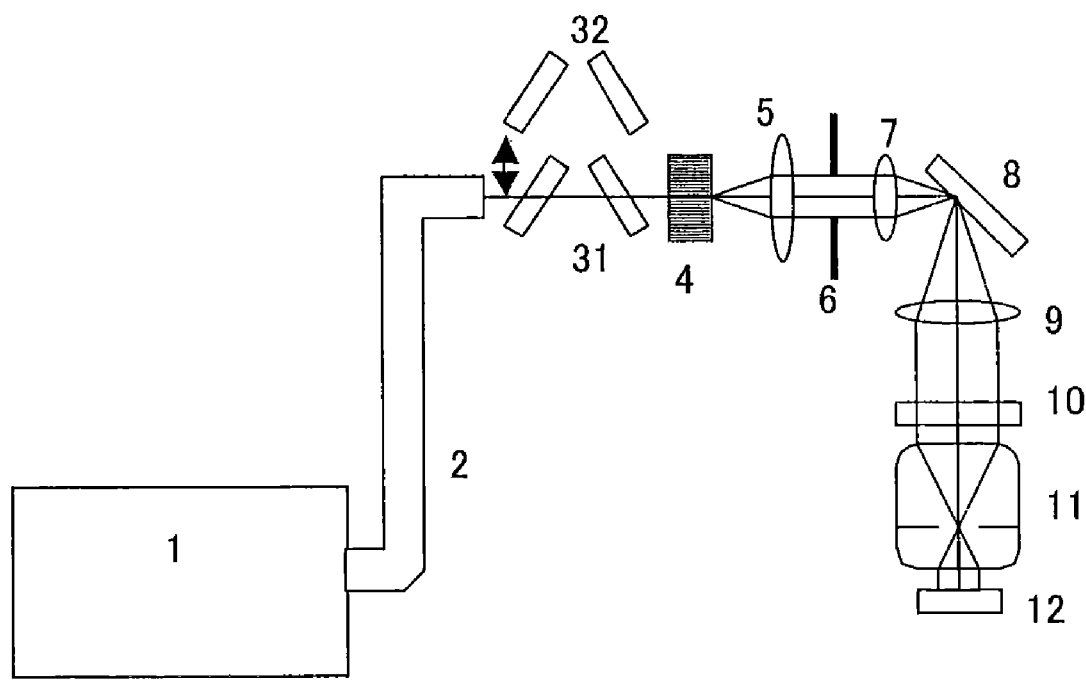
FIG. 2 is a schematic structure view of an exposure apparatus that includes an illumination optical system of the second embodiment according to the present invention.

With reference to FIGS. 1 and 2, a description will be given of an illumination optical system of the second embodiment according to the present invention. A schematic structure of an exposure apparatus that includes the illumination optical system of the second embodiment is almost the same as the first embodiment. The light source 1 uses KrF excimer laser, ArF excimer laser, or $F_2$ laser etc. The beam shaping optical system 2 leads the light from the light source 1, and forms the desired light intensity distribution on the fly-eye lens 4. The polarizing element 3 adjusts the polarization ratio to be the predetermined polarization ratio at the reticle 10 surface. The fly-eye lens 4 wavefront-divides the light from the light source 1, and forms the plural secondary light source. The condenser lens 5 overlaps light from the secondary light source formed by the fly-eye lens 4 to the masking blade 6. Thereby, the uniformly light intensity distribution is obtained. The lens 7 and the lens 9 are the relay optical system, and form the conjugate relationship between the masking blade 6 and the reticle 10 by reflecting the light that passes through the masking blade 6 at the folding mirror 8. The illumination optical system is composed of items from the light source 1 to the lens 9 just before the reticle 10. The projection optical system 11 projects the pattern of the reticle 10 onto the wafer 12 that the photoresist is applied.

The polarization ratio that the polarizing element 3 should adjust depends on the birefringence amount that changes between the polarizing element 3 and the reticle 10. For example, the following are assumed: the birefringence amount of the optical member from the polarizing element 3 to the reticle 10 surface is 2 nm/cm, 25% of S-polarized light is converted into P-polarized light, and 25% of P-polarized light is converted into S-polarized light. When the partial polarized light of S-polarized light:P-polarized light=2:1 illuminates the reticle 10 surface, the polarization ratio of S-polarized light and P-polarized light (=X:Y) that the polarizing element 3 adjusts is assumed to be X:Y=5:1 by X×0.75+Y×0.25:X×0.25+Y×0.75=3:1.

Actually, because the polarization ratio converted by each point in the pupil of the reticle 10 surface is different, the polarization ratio that the polarizing element 3 adjusts may be decided so that the average polarization ratio in the pupil becomes the desired value. The amount of polarized light from the polarizing element 3 to the reticle 10 surface changes when the birefringence of the optical member changes by continuously irradiating light when NA of the illumination system is changed or the illumination area is changed.

Then, the instant embodiment enables the exchange of two polarizing elements 31 and 32 that have a different characteristic as shown in FIG. 2, and when the rate that the polarized light changes between from the polarizing element 3 to the reticle 10 surface changes, those polarizing elements are exchanged. The polarizing elements that can be exchanged are not limited to two, and may be three or more. The polarizing elements are not exchanged, and the polarized light may be continuously changed by changing the incline angle of the surface of the polarizing element. When the polarization ratio that the polarizing element adjusts is set, a polarized light monitor (not shown) that measures a light intensity ratio of S-polarized light and P-polarized light is installed in a wafer stage, the polarized light monitor is inserted in the wafer 12 surface and the polarization state is detected, and the polarization ratio may be adjusted so that the light intensity ratio of S-polarized light and P-polarized light becomes the desired ratio.

THIRD EMBODIMENT

Figure 3:
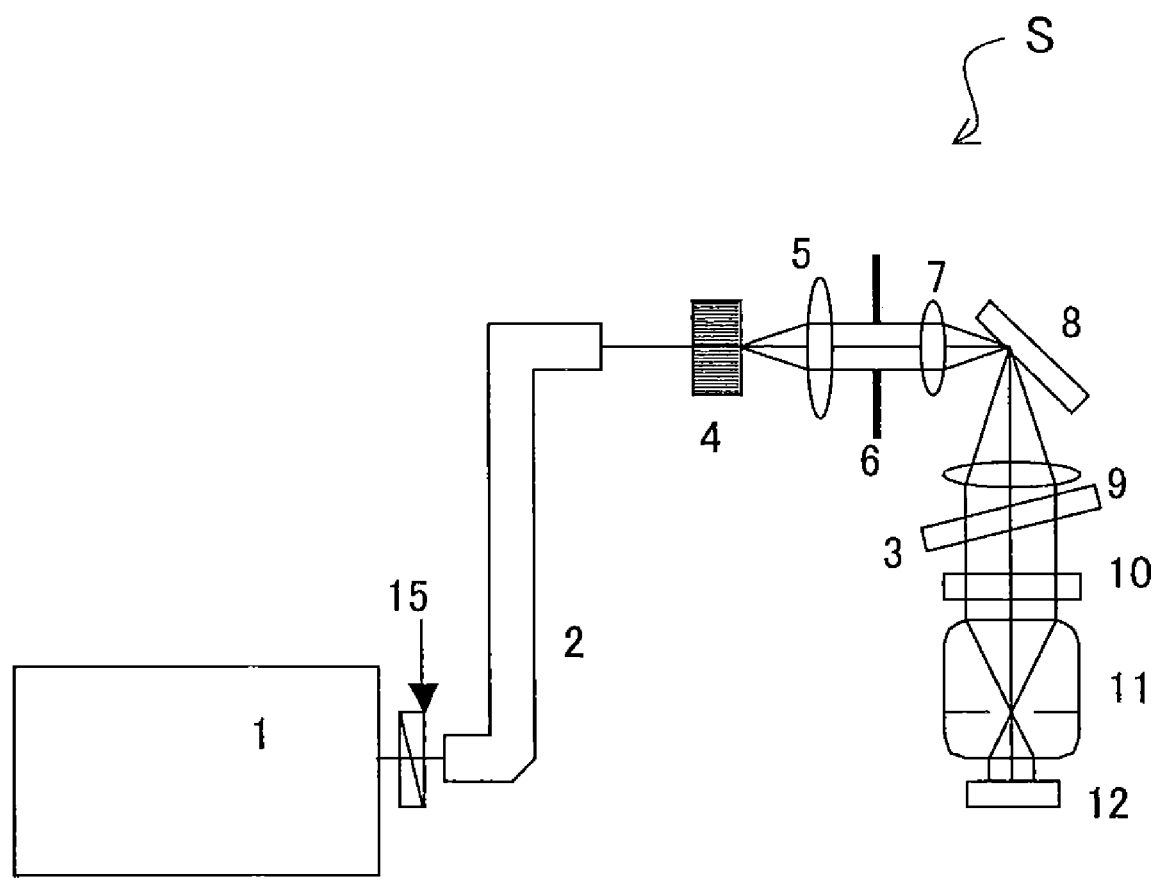
FIG. 3 is a schematic structure view of an exposure apparatus that includes an illumination optical system of the third embodiment according to the present invention.

With reference to FIG. 3, a description will be given of an illumination optical system of the third embodiment according to the present invention. FIG. 3 is a schematic structure view of an exposure apparatus S that includes the illumination optical system of the instant embodiment. The light source 1 uses KrF excimer laser, ArF excimer laser, or $F_2$ laser etc. A random polarized plate 15 polarizes the light from the light source 1 in two orthogonal directions, and forms two light beams from a random polarized light of the light intensity ratio of 1:1. The random polarized plate 15 uses a plane parallel plate that stacks a sphenoid member formed from a birefringence material and a sphenoid member formed from a non-birefringent material. The beam shaping optical system 2 channels the light from the light source 1, and forms the desired light intensity distribution of the fly-eye lens 4. The fly-eye lens 4 wavefront-divides the light from the light source 1, and forms the plural secondary light source. The condenser lens 5 overlaps light from the secondary light source formed by the fly-eye lens 4 to the masking blade 6. Thereby, the uniformly light intensity distribution is obtained. The lens 7 and the lens 9 are the relay optical system, and form the conjugate relationship between the masking blade 6 and the reticle 10 by reflecting the light that passes through the masking blade 6 at the folding mirror 8. The polarizing element 3 adjusts the polarization ratio to be the predetermined polarization ratio at the reticle 10 surface. The illumination optical system is composed of the light source 1 to the polarizing element 3 just before the reticle 10. The projection optical system 11 projects the pattern of the reticle 10 onto the wafer 12 that the photoresist is applied. The instant embodiment adjusts the polarization ratio just on the reticle 10 surface by the polarizing element 3 so as not to receive the influence of the birefringent optical member in the illumination system.

The light intensity ratio of the S-polarized light and P-polarized light of the light that is incident onto the polarizing element 3 may be a random polarized light of 1:1. In the random polarized light that the light intensity ratio of the S-polarized light and P-polarized light is 1:1, even when the polarization state is changed by the optical member of the illumination system having the birefringence, the light amount that changes from S-polarized light into P-polarized light is equal to the light amount that changes from P-polarized light into S-polarized light. Therefore, the random polarized light, that the light intensity ratio of the S-polarized light and P-polarized light maintained to 1:1, is incident onto the polarizing element 3 without depending on the birefringence amount of the optical member.

Then, the random polarized light plate 15 converts the light from the light source 1 into the polarization state so that the light intensity ratio of S-polarized light and S-polarized light is the random polarized light of 1:1. The birefringence amount of the optical members from the light source to the polarizing element need not be considered by arranging the random polarized light plate, so the random polarized plate is arranged between the light source and the polarizing element in other embodiments. When the light from the laser in a linearly polarized light, a λ/4 plate may be used instead of the random polarized light plate.

In a scanning type projection exposure apparatus, the reticle 10 surface as the target surface is, generally, illuminated using an illumination area of a rectangle shape that has short length direction and long length direction, elliptical shape, or segment shape. Then, the reticle is scanned along the short length direction. The third embodiment is a composition in which a surface of polarizing element where dielectric film is formed is inclined in the scanning direction of the projection exposure apparatus, in other words, the short length direction of the illumination area. Thereby, a space in the direction of the optical axis to insert the polarizing element in the optical path can be reduced.

FOURTH EMBODIMENT

Figure 4:
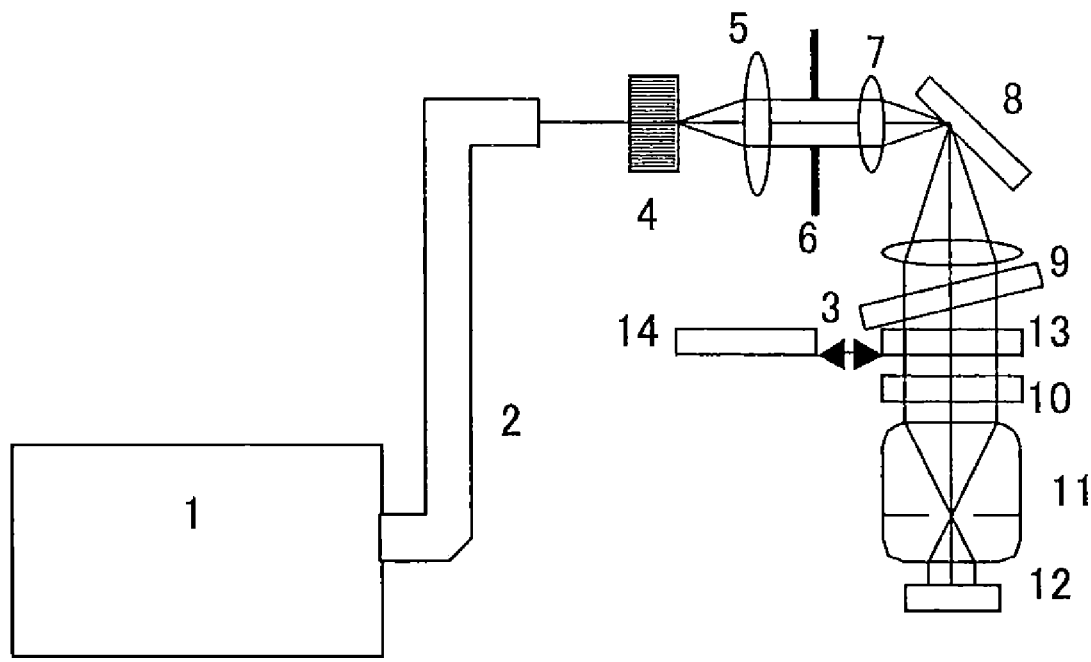
FIG. 4 is a schematic structure view of an exposure apparatus that includes an illumination optical system of the fourth embodiment according to the present invention.

With reference to FIG. 4, a description will be given of an illumination optical system of the fourth embodiment according to the present invention. FIG. 4 is a schematic structure view of an exposure apparatus S that includes the illumination optical system of the instant embodiment. The structure of the fourth embodiment is the structure of the third embodiment shown in FIG. 3 in addition to a structure that a phase plate (λ/2 plate) 14 and parallel plane plate 13 can enable to locate on and remove from the optical path between the lens 9 and the reticle 10.

When the polarizing element that polarizes the light using the dielectric film is used, it is easy to produce the transmittance of S-polarized light on the film surface higher than the transmittance of P-polarized light, but it is difficult to produce the transmittance of P-polarized light on the film surface higher than the transmittance of S-polarized light. Therefore, for example, when the reticle is illuminated by the polarized light with the light intensity ratio of S-polarized light:P-polarized light=1:3, it is adjusted beforehand by the polarizing element to S-polarized light:P-polarized light=3:1. Then, the polarized light direction is rotated by 90 degrees by rotating the phase by 180 degrees by using the λ/2 plate 14, and the polarized light with the light intensity ratio of S-polarized light:P-polarized light=1:3 is achieved in the reticle 10 surface.

FIFTH EMBODIMENT

Figure 10:
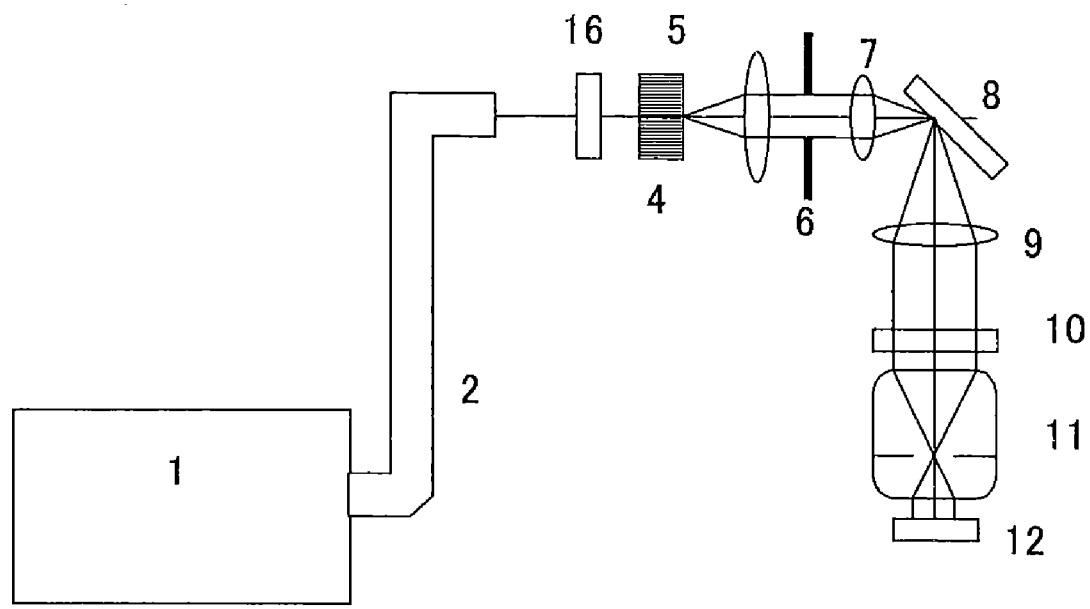
FIG. 10 is a schematic structure view of an exposure apparatus that includes an illumination optical system of the fifth embodiment according to the present invention.

With reference to FIG. 10, a description will be given of an illumination optical system of the fifth embodiment according to the present invention. FIG. 10 is a schematic structure view of an exposure apparatus S that includes the illumination optical system of the instant embodiment. The fifth embodiment decreases a light loss by changing the polarized state of the light source by a phase plate 16 which changes the predetermined polarization state when the polarization state of the light source is a predetermined state (for instance, linearly polarized light) to improve the problem of the first embodiment shown in FIG. 1. The first embodiment generates the light loss by leaking desired polarized light through the polarizing elements that consists of dielectric multilayer film. The illumination optical system of the fifth embodiment should maintain the polarization state of the light source to the phase plate 16, as the polarizing element, and creates the birefringence of the optical member on the optical path from the light source to polarizing element of 1 nm/cm or less on m+2σ. Therefore, the change in the polarization ratio can be suppressed to 10% or less as shown in FIG. 9, and an enough imaging performance can be obtained. Moreover, the loss of the light intensity is a little, and it is possible to illuminate the reticle by the high intensity light.

SIXTH EMBODIMENT

Figure 5:
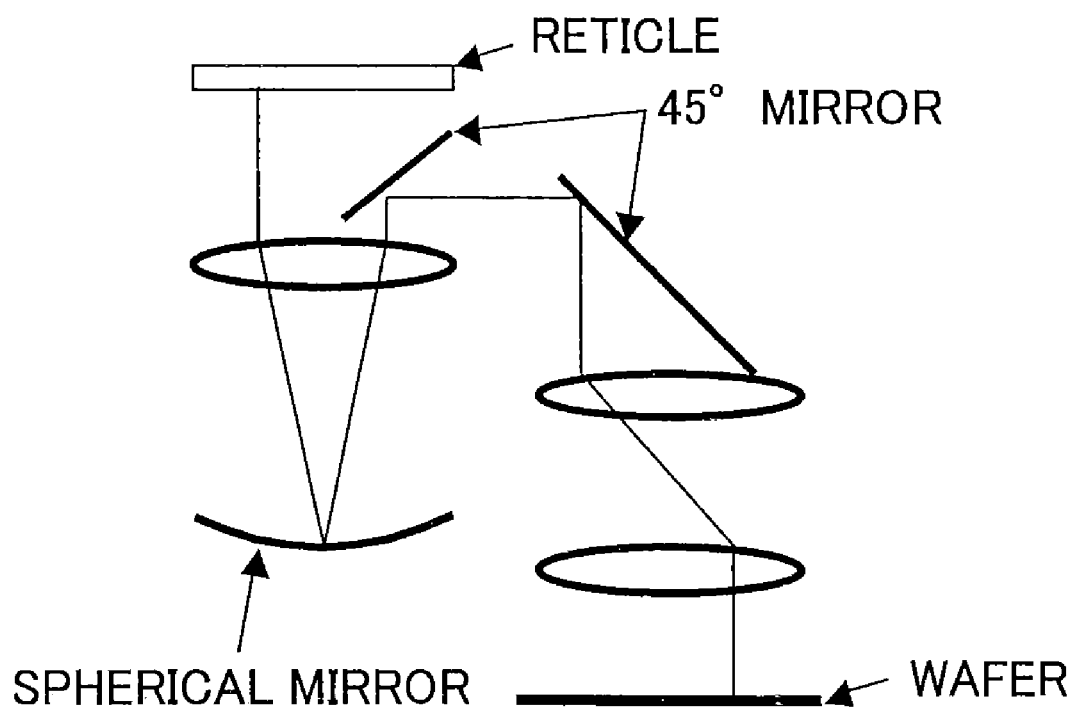
FIG. 5 is a block diagram that shows structure example of a conventional catadioptric system.
Figure 6:
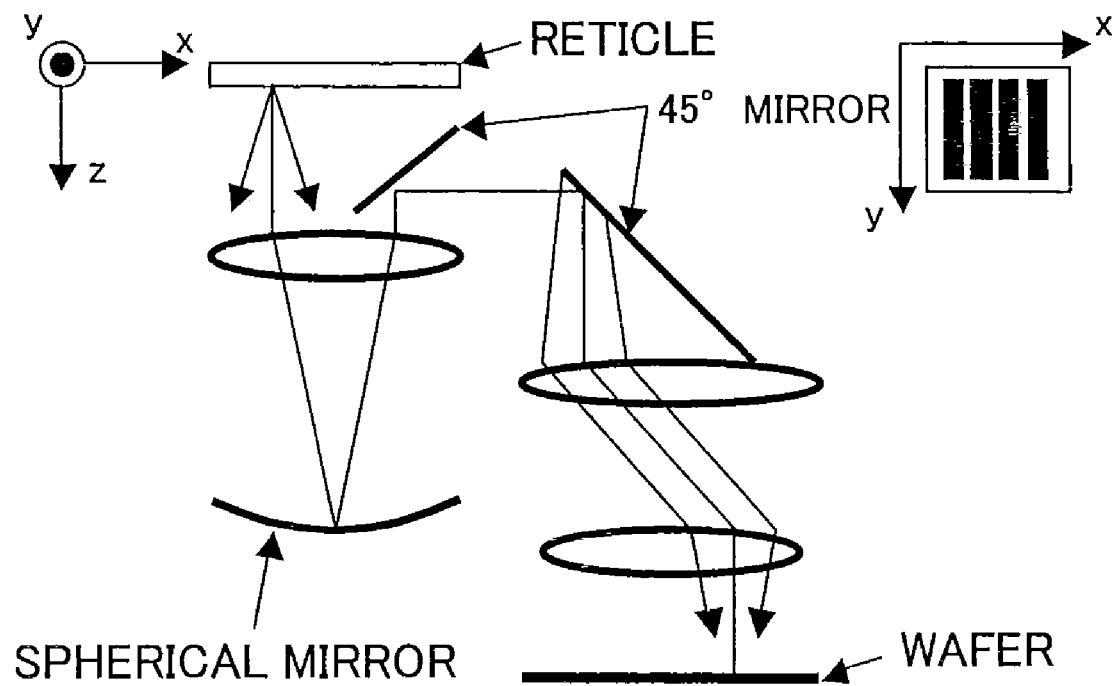
FIG. 6 is a block diagram that shows a case where a reticle is applied to form repeated patterns in y direction for the optical system shown in FIG. 5.
Figure 7A:
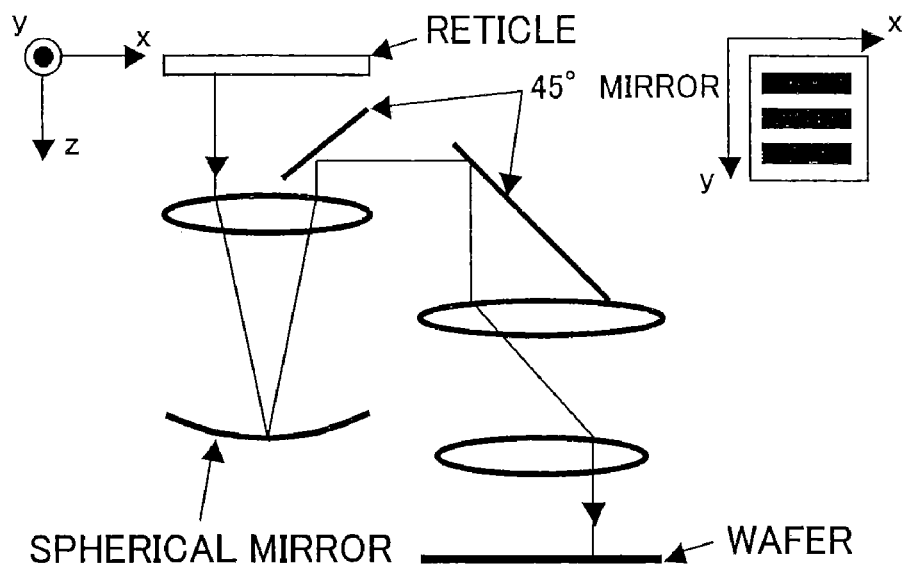
FIG. 7 is a block diagram that shows a case where a reticle is applied to form repeated patterns in x direction for the optical system shown in FIG. 5, 7A is a plane view along y direction, and 7B is a side view along x direction.
Figure 7B:
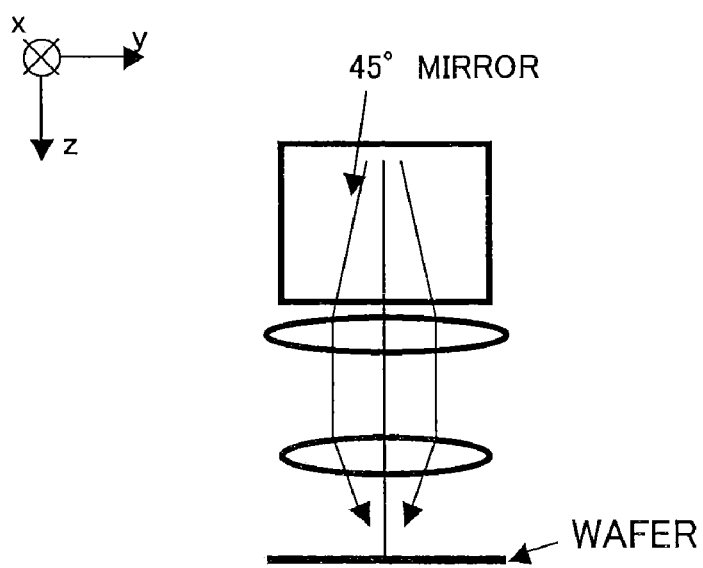
Figure 8A:
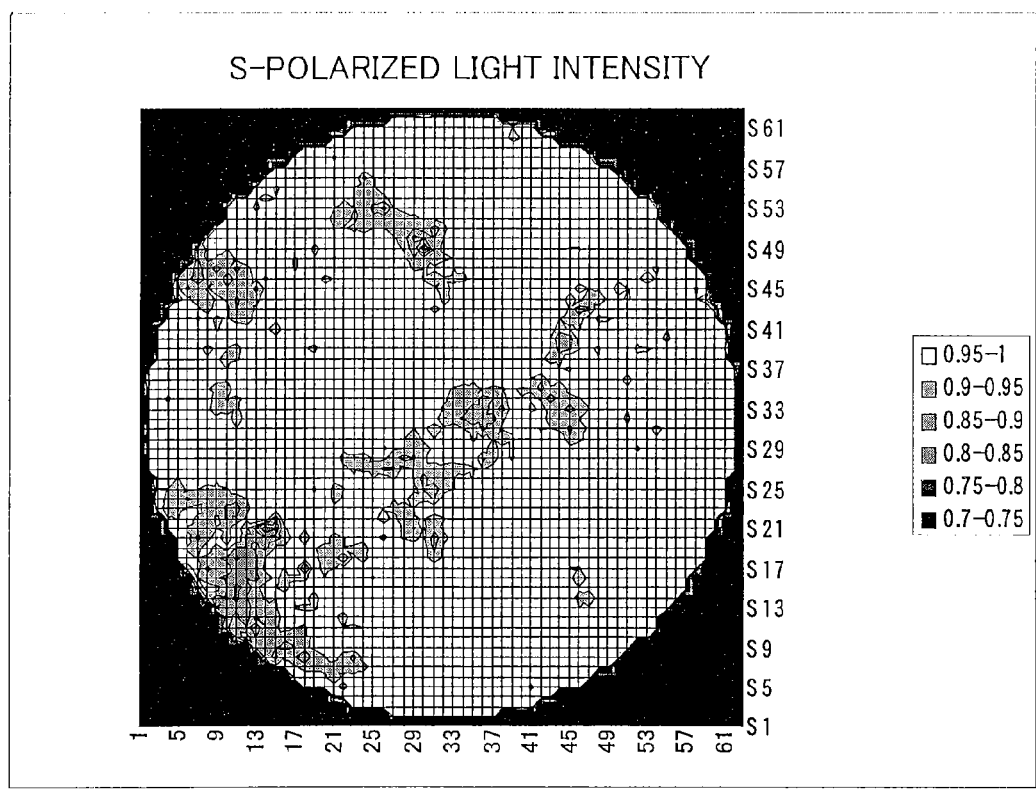
FIGS. 8 (A and B) is a polarized light intensity distribution view that shows a calculation result of a polarized light change in an illumination optical system that has a birefringence amount of 2 nm/cm.
Figure 8B:
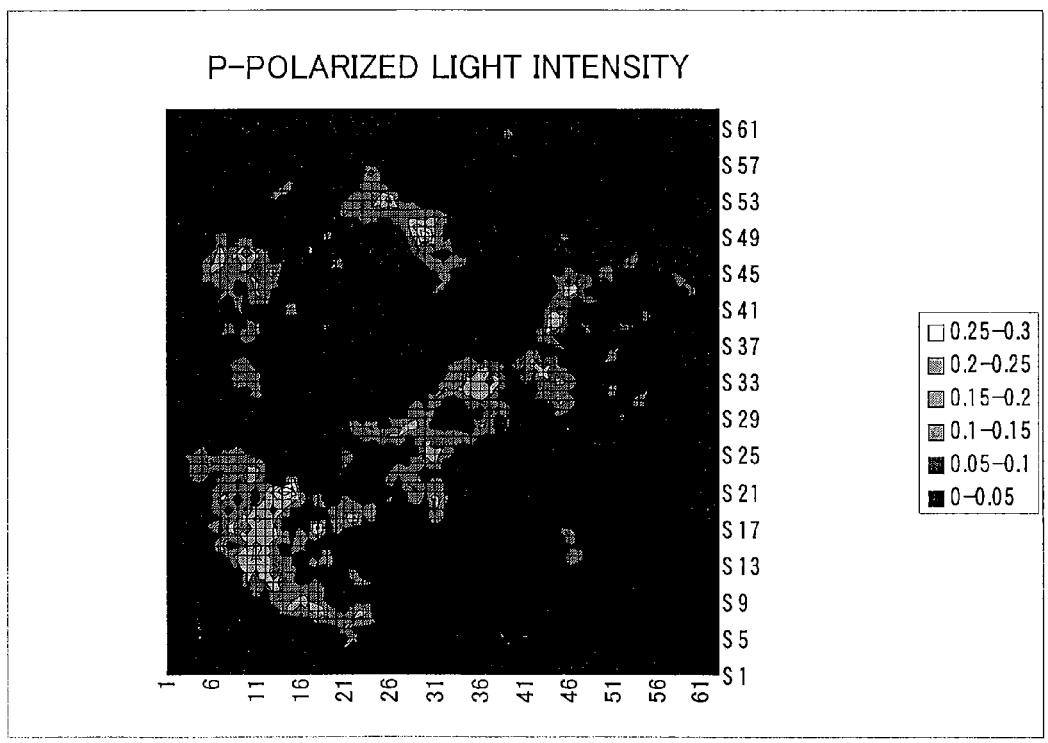
Figure 11:
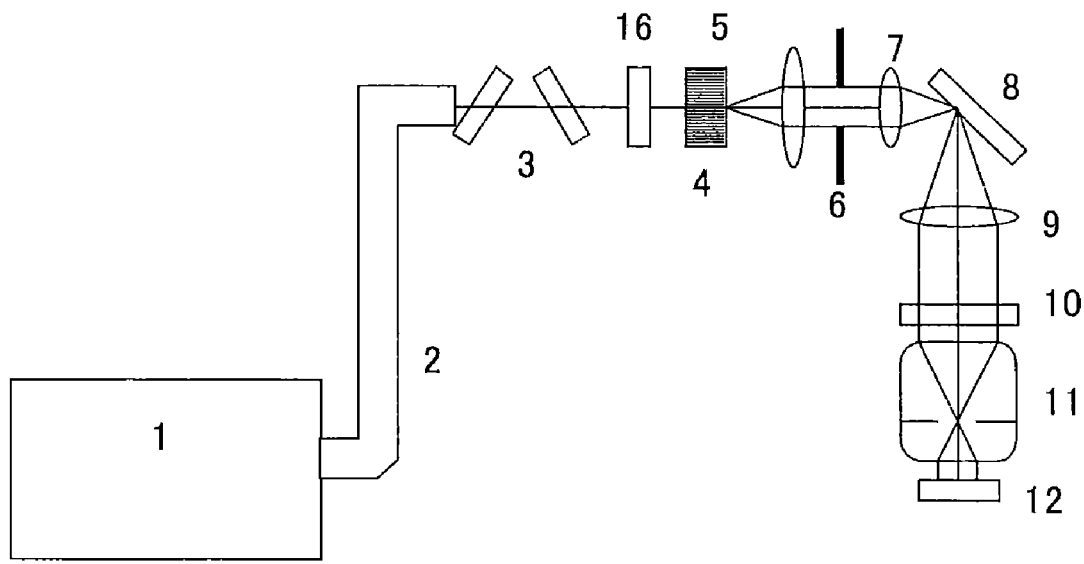
FIG. 11 is a schematic structure view of an exposure apparatus that includes an illumination optical system of the sixth embodiment according to the present invention.

With reference to FIG. 11, a description will be given of an illumination optical system of the sixth embodiment according to the present invention. FIG. 11 is a schematic structure view of an exposure apparatus S that includes the illumination optical system of the instant embodiment. The sixth embodiment is the structure of the fifth embodiment shown in FIG. 5 in addition to the polarization separating plate 3. The illumination optical system of the fifth embodiment should strictly maintain the polarization state of the light source to the phase plate 16 as the polarizing element, and the birefringence of the optical member on the optical path from the light source to the polarizing element should be 1 nm/cm or less on m+2σ. The sixth embodiment maintains the polarization state of the light source, and removes unnecessary polarized light of the collapsed polarization state by the polarization separating plate 3. Therefore, even if the birefringence of the optical member on the optical path from the light source to the polarizing element is allowed to 5 nm/cm or less on m+2σ, the polarization state of the light that is incidence onto the phase plate 16 can be maintained in the desired state. The polarization state of the light that is incident onto the polarization separating plate is preserved compared with the first embodiment, so the light intensity that does not reach the target surface by the reflection decrease, and the light intensity loss decreases. Therefore, the change in the polarization ratio can be suppressed to 10% or less as shown in FIG. 9, and an enough imaging performance can be obtained. Moreover, the loss of the light intensity is a little, and it is possible to illuminate the reticle by the high intensity light.

The explanation chiefly explained the partial polarized illumination to correct the transmittance difference of the projection optical system by the polarized light, but the present invention can be applied also to the polarized light illumination whose diffraction light is only S-polarized light to improve the contrast of the predetermined pattern.

SEVENTH EMBODIMENT

Figure 12:
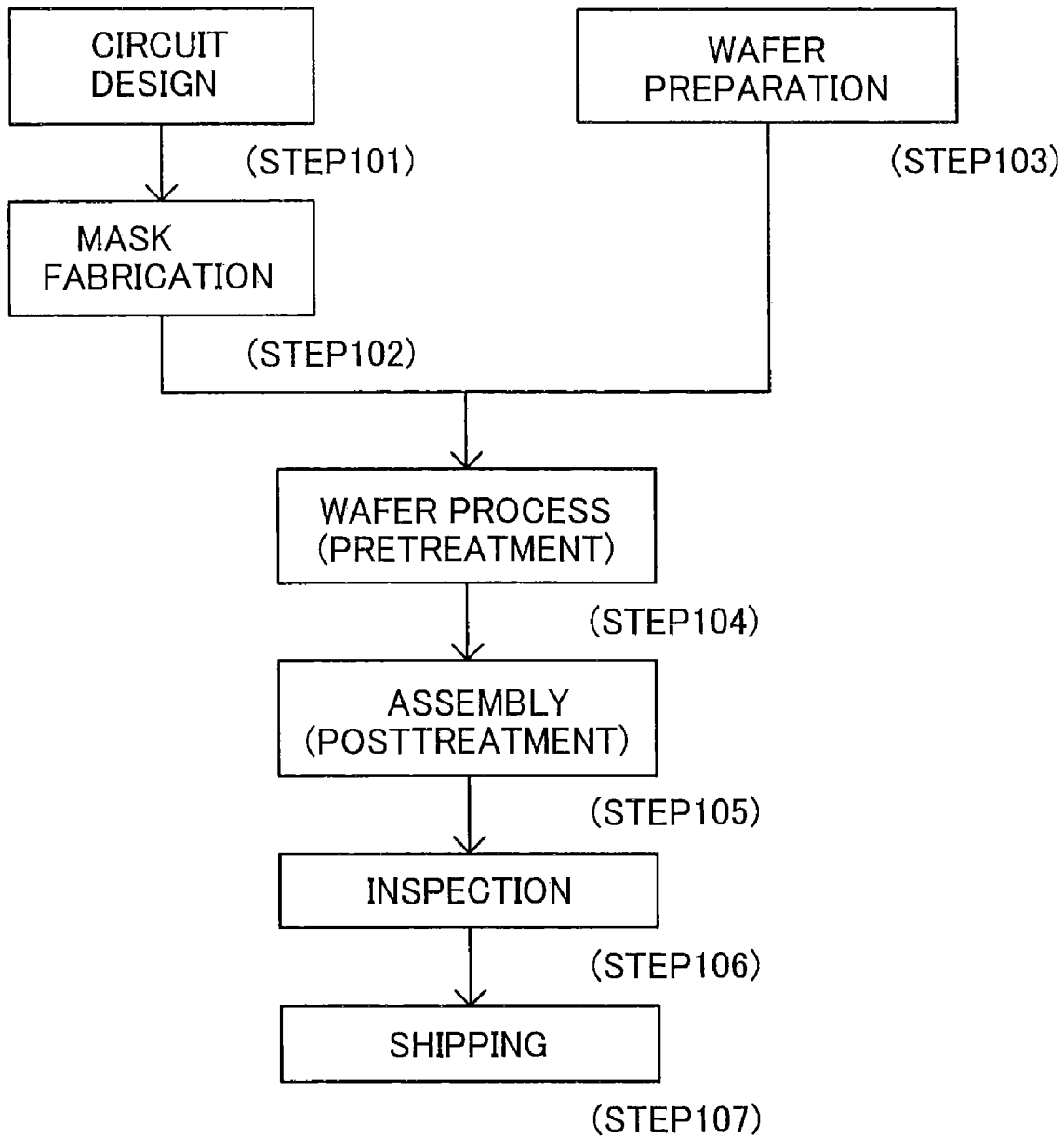
FIG. 12 is a flowchart for explaining how to fabricate devices.
Figure 13:
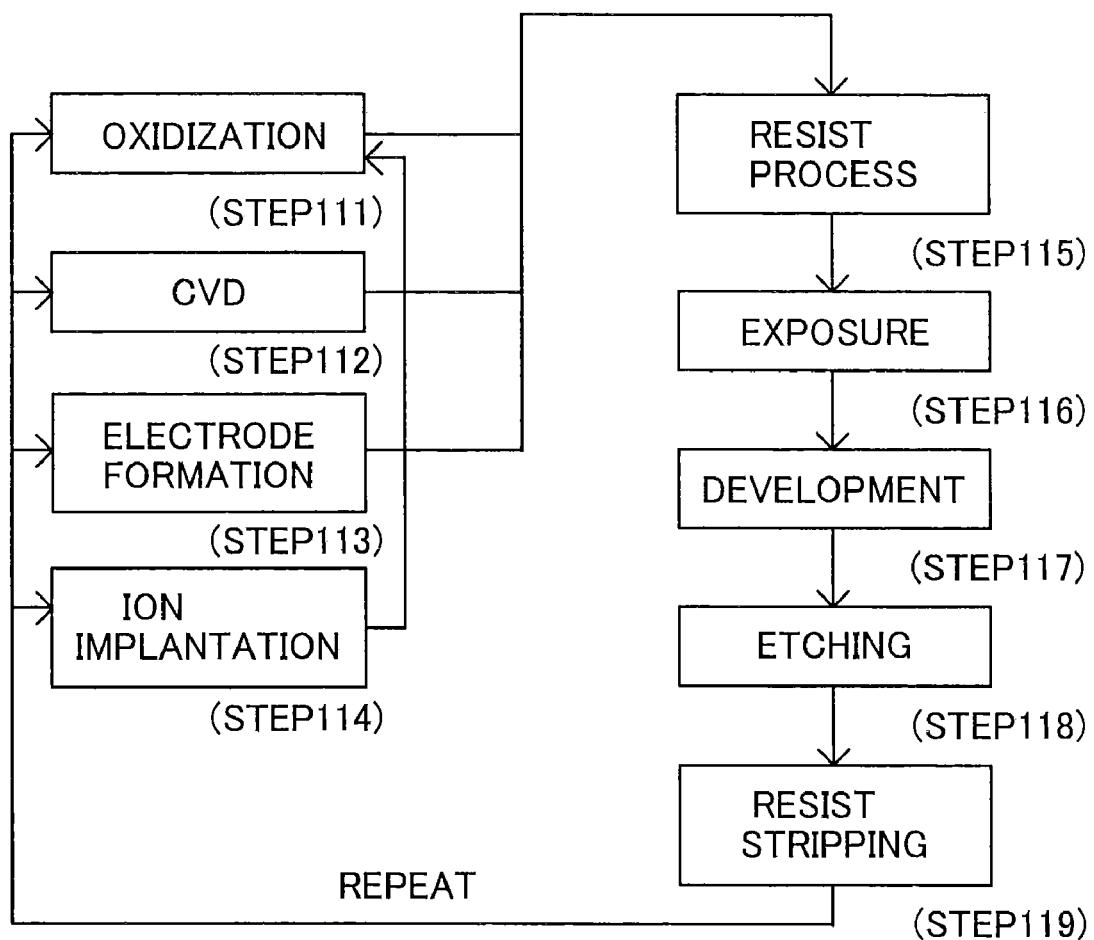
FIG. 13 is a detailed flowchart of a wafer process in Step 104 of FIG. 12.

Referring now to FIGS. 12 and 13, a description will be given of an embodiment of a device fabrication method using the above mentioned exposure apparatus S. FIG. 12 is a flowchart for explaining how to fabricate devices (i.e., semiconductor chips such as IC and LSI, LCDs, CCDs, and the like). Here, a description will be given of the fabrication of a semiconductor chip as an example. Step 101 (circuit design) designs a semiconductor device circuit. Step 102 (mask fabrication) forms a mask having a designed circuit pattern. Step 103 (wafer making) manufactures a wafer (substrate) using materials such as silicon. Step 104 (wafer process), which is also referred to as a pretreatment, forms the actual circuitry on the wafer through lithography using the mask and wafer. Step 105 (assembly), which is also referred to as a post-treatment, forms into a semiconductor chip the wafer formed in Step 4 and includes an assembly step (e.g., dicing, bonding), a packaging step (chip sealing), and the like. Step 106 (inspection) performs various tests on the semiconductor device made in step 105, such as a validity test and a durability test. Through these steps, a semiconductor device is finished and shipped (Step 107).

FIG. 13 is a detailed flowchart of the wafer process in Step 104. Step 111 (oxidation) oxidizes the wafer's surface. Step 112 (CVD) forms an insulating layer on the wafer's surface. Step 113 (electrode formation) forms electrodes on the wafer by vapor disposition and the like. Step 114 (ion implantation) implants ions into the wafer. Step 115 (resist process) applies a photosensitive material onto the wafer. Step 116 (exposure) uses the exposure apparatus S to expose a circuit pattern from the mask onto the wafer. Step 117 (development) develops the exposed wafer. Step 118 (etching) etches parts other than a developed resist image. Step 119 (resist stripping) removes unused resist after etching. These steps are repeated to form multi-layer circuit patterns on the wafer. The fabrication method of the instant embodiment can fabricate higher-quality devices (in other words, the desired stroke width devices). Thus, the device fabrication method using the exposure apparatus S, and resultant devices constitute one aspect of the present invention.

The present invention polarized light-illuminates using the illumination optical system that includes the glass material that has the birefringence, and can improve the resolution of the projection exposure apparatus. The illumination optical system can achieve the polarized light illumination on the reticle surface.

Furthermore, the present invention is not limited to these preferred embodiments and various variations and modifications may be made without departing from the scope of the present invention.

This application claims a foreign priority benefit based on Japanese Patent Applications No. 2004-128602, filed on Apr. 23, 2004, which is hereby incorporated by reference herein in its entirety as if fully set forth herein.

What is claimed is:

1. An exposure apparatus comprising:
an illumination optical system for illuminating a reticle on a target surface using light from a light source; and
a projection optical system for projecting a pattern of the reticle onto a substrate, wherein the illumination optical system includes:
   a polarizing element that is arranged in an optical path from the light source to the target surface near a pupil position of the illumination optical system, and adjusts a polarization ratio of the light; and
   plural optical elements that are arranged in the optical path from the polarizing element to the target surface, wherein the total birefringence of the plural optical elements satisfies m+2σ<1.0 nm/cm, where m is an average of birefringence amount of a glass material of the plural optical elements, and σ is a standard variation birefringence amount of glass materials of the plural optical elements.

2. An exposure apparatus comprising:
an illumination optical system for illuminating a reticle on a target surface using light from a light source; and
a projection optical system for projecting a pattern of the reticle onto a substrate, wherein said illumination optical system includes:
   a polarizing element that is arranged in an optical path from the light source to the target surface, and adjusts a polarization ratio of the light;
   a dielectric multilayer film formed on at least one surface of the polarization element, which surface serves as a polarization splitter and inclines to an optical axis of the light by 15° to 60°; and
   plural optical elements that are arranged in the optical path from the polarizing element to the target surface, wherein the total birefringence of the plural optical elements satisfies m+2σ<1.0 nm/cm, where m is an average of birefringence amount of glass materials of the plural optical elements, and σ is a standard variation birefringence amount of the glass material of the plural optical elements.

3. An exposure apparatus comprising:
an illumination optical system for illuminating a reticle on a target surface using light from a light source; and
a projection optical system for projecting a pattern of the reticle onto a substrate, wherein the illumination optical system includes:
   a polarizing element that is arranged in an optical path from the light source to the target surface, and adjusts a polarization ratio of the light, the polarizing element being a λ/4 phase plate or a λ/2 phase plate; and
   plural optical elements that are arranged in the optical path from the polarizing element to the target surface, wherein the total birefringence of the plural optical elements satisfies m+2σ<1.0 nm/cm, where m is an average of birefringence amount of glass materials of the plural optical elements, and σ is a standard variation birefringence amount of the glass materials of the plural optical elements.

4. An exposure apparatus comprising:
an illumination optical system for illuminating a reticle on a target surface using light from a light source; and
a projection optical system for projecting a pattern of the reticle onto a substrate, wherein the illumination optical system includes:
   a polarizing element that is arranged in an optical path from the light source to the target surface, and adjusts a polarization ratio of the light, a light intensity bary-center of rays of the light that is incident upon the-polarizing element being substantially parallel to an optical axis of the light; and
   plural optical elements that are arranged in the optical path from the polarizing element to the target surface, wherein the total birefringence of the plural optical elements satisfies m+2σ<1.0 nm/cm, where m is an average of birefringence amount of glass materials of the plural optical elements, and σ is a standard variation birefringence amount of the glass materials of the plural optical elements.

5. An exposure apparatus comprising:
an illumination optical system for illuminating a reticle on a target surface using light from a light source; and
a projection optical system for projecting a pattern of the reticle onto a substrate, wherein the illumination optical system includes:
   a polarizing element that is removably arranged in an optical path from the light source to the target surface, and adjusts a polarization ratio of the light; and
   plural optical elements that are arranged in the optical path from the polarizing element to the target surface, wherein the total birefringence of the plural optical elements satisfies m+2σ<1.0 nm/cm, where m is an average of birefringence amount of glass materials of the plural optical elements, and σ is a standard variation birefringence amount of the glass materials of the plural optical elements.

6. An exposure apparatus comprising:
an illumination optical system for illuminating a reticle on a target surface using light from a light source; and
a projection optical system for projecting a pattern of the reticle onto a substrate, wherein the illumination optical system includes:
   plural polarizing elements that are exchangeably and removably arranged in an optical path from the light source to the target surface, adjust a polarization ratio of the light, and have different polarized light adjusting amount; and
   plural optical elements that are arranged in the optical path from the polarizing element to the target surface, wherein the total birefringence of the plural optical elements satisfies m+2σ<1.0 nm/cm, where m is an average of birefringence amount of glass materials of the plural optical elements, and σ is a standard variation birefringence amount of the glass materials of the plural optical elements.

7. A scanning exposure apparatus comprising:
an illumination optical system for illuminating a reticle on a target surface using light from a light source; and
a projection optical system for projecting a pattern of the reticle onto a substrate, wherein the illumination optical system includes:
   a polarizing elements that is arranged in an optical path from the light source to the target surface, and adjusts a polarization ratio of the light;
   a dielectric multilayer film formed on at least one surface of the polarizing element, which surface inclines to a scanning direction; and
   plural optical elements that are arranged in the optical path from the polarizing element to the target surface, wherein the total birefringence of the plural optical elements satisfies m+2σ<1.0 nm/cm, where m is an average of birefringence amount of glass materials of the plural optical elements, and σ is a standard variation birefringence amount of the glass materials of the plural optical elements.

* * * * *